(12) United States Patent
Sander

(10) Patent No.: US 7,626,795 B2
(45) Date of Patent: Dec. 1, 2009

(54) OVERLOAD PROTECTION FOR CONTROLLABLE CURRENT CONSUMERS

(75) Inventor: Rainald Sander, Munich (DE)

(73) Assignee: Infineon Technologies AG, Munich (DE)

( * ) Notice: Subject to any disclaimer, the term of this patent is extended or adjusted under 35 U.S.C. 154(b) by 250 days.

(21) Appl. No.: 11/677,852

(22) Filed: Feb. 22, 2007

(65) Prior Publication Data
US 2007/0195476 A1   Aug. 23, 2007

(30) Foreign Application Priority Data
Feb. 22, 2006   (DE)   ........................ 10 2006 008 292

(51) Int. Cl.
*H02H 9/08* (2006.01)
(52) U.S. Cl. ..................... 361/93.1; 361/93.9
(58) Field of Classification Search ....... 361/93.7–93.9, 361/103, 106, 93.1
See application file for complete search history.

(56) References Cited

U.S. PATENT DOCUMENTS

| | | | | |
|---|---|---|---|---|
| 3,740,730 A | | 6/1973 | Ho et al. ..................... 340/173 |
| 4,771,357 A | * | 9/1988 | Lorincz et al. ................ 361/87 |
| 4,931,778 A | * | 6/1990 | Guajardo ..................... 340/664 |
| 4,937,646 A | | 6/1990 | Tihanyi et al. ................ 357/43 |
| 5,422,593 A | | 6/1995 | Fujihira ....................... 327/561 |
| 5,541,799 A | * | 7/1996 | Schmidt et al. ............... 361/18 |
| 6,538,480 B2 | * | 3/2003 | Takada et al. ............... 327/108 |
| 6,930,870 B2 | * | 8/2005 | Nobe et al. .................. 361/103 |
| 6,992,467 B1 | | 1/2006 | Fey ............................. 323/266 |

FOREIGN PATENT DOCUMENTS

| | | |
|---|---|---|
| DE | 22 30 686 C3 | 7/1975 |
| DE | 43 15 738 A1 | 11/1993 |
| DE | 200 05 927 U1 | 11/2000 |
| DE | 43 20 112 C2 | 10/2003 |
| EP | 0 208 970 A1 | 6/1986 |

* cited by examiner

*Primary Examiner*—Danny Nguyen
(74) *Attorney, Agent, or Firm*—Eschweiler & Associates, LLC

(57) ABSTRACT

A device and a method for protecting a controllable current consumer is provided wherein the current through the current consumer is detected and the control signal is altered when exceeding a threshold current such that the current through the current consumer will be altered. Thus, the circuit is implemented such that the current consumer is at the same time protected against overheating.

20 Claims, 3 Drawing Sheets

OVERLOAD PROTECTION FOR CONTROLLABLE CURRENT CONSUMERS

CROSS-REFERENCE TO RELATED APPLICATIONS

This application claims priority from German Patent Application No. 10 2006 008 292.3, which was filed on Feb. 22, 2006, and is incorporated herein by reference in its entirety.

TECHNICAL FIELD

The present invention relates to protecting a controllable current consumer from too high through-currents.

BACKGROUND

In order to ensure perfect functioning of electronical devices, it is important to protect them from overload, i.e. from too high through-currents. A frequent consequence of overload is heating of the electronical device. Using a temperature sensor mounted to the electronical device, overload of the electronical device can be determined. A multi-chip solution including overload protection is described in EP 0208970 A1 and U.S. Pat. No. 4,937,646 and is shown in FIG. 7. In this example, the temperature sensor has been mounted in the form of a thyristor 710 on a field-effect transistor (MOSFET) 720 which in turn is located on a leadframe 730 and comprises a source terminal (S), a gate terminal (G) and a drain terminal (D) (not shown). The thyristor is dimensioned such that it switches on before a critical temperature for the MOSFET of 150 to 180° C. is reached. Thus, the gate source capacitance of the MOSFET is short-circuited and the MOSFET switches off.

Further development in the integration in power transistor technologies has resulted in the current density increasing strongly. This increase can take place in a very short time and the result in an overload case will be very large temperature gradients. Detecting the temperature by a separate chip is delayed due to thermal capacitances and this delay may result in the power transistor not to be protected in time and the power transistor to be destroyed.

SUMMARY

According to an embodiment, a device for protecting a current consumer, the current consumer having a current path between two current path terminals and a control terminal to which a control signal may be applied by means of which a current through the current path is controllable, may have: means for detecting the current in the current path; and means for altering the control signal, wherein the means for altering the control signal is implemented to alter the control signal such that when a current value above a threshold value is detected the control signal causes a current reduction.

According to another embodiment, a method for protecting a current consumer, the current consumer having a current path between two current path terminals and a control terminal to which a control signal may be applied by means of which a current through the current path is controllable, may have the steps of: detecting the current in the current path; and altering the control signal, such that when a current value above a current threshold is detected the control signal causes a current reduction.

BRIEF DESCRIPTION OF THE DRAWINGS

Preferred embodiments of the present invention will be detailed subsequently referring to the appended drawings, in which.

DETAILED DESCRIPTION

Figure 1:
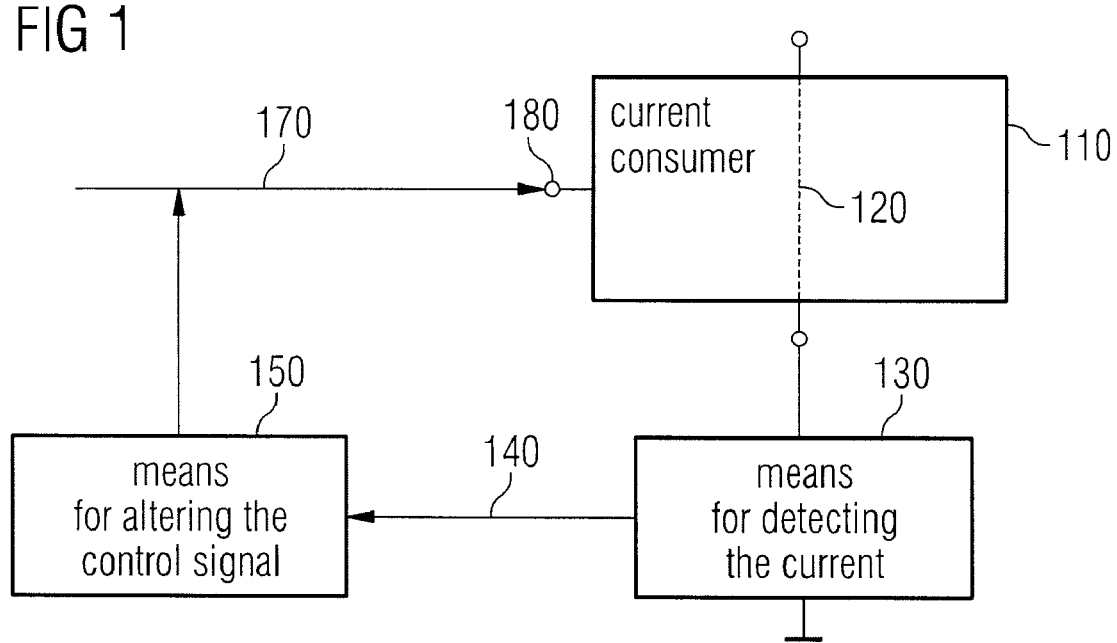
FIG. 1 is a schematic illustration of an embodiment of the present invention.

The present invention is based on the central idea that an overload case can be determined by a direct current measurement detecting the current through the current consumer and that, should the current detected be above a threshold, the control signal will be altered via feedback such that the current through the current consumer decreases and the current consumer is protected.

According to an embodiment, the controllable current consumer is a power transistor, such as, for example, an enhancement MOSFET. The overcurrent circuit is integrated along with a temperature sensor, wherein both signals, overtemperature and/or overcurrent, cause a low-resistance connection between the gate terminal and the source terminal of the power transistor such that the current through the current consumer is brought back to the normal range.

A considerable advantage of the inventive concept compared to conventional ones is that no heating of the current consumer and, consequently, the temperature sensor need occur, but that the cause for the overload of the current consumer is detected directly and immediate feedback to the control signal of the current consumer takes place. In contrast to an overload protection only coming into effect after the current consumer has heated up, time delay is avoided, as a result of finite heat capacitances of both the current consumer and the temperature sensor. Thus, the time in which the current consumer operates outside the normal range is reduced considerably and the result is a more efficient protection from destruction for both the current consumer and neighboring devices. This is of particular advantage in modern power transistors in which the current density may increase very quickly within a short time.

Since the inherent control function of the current consumer is made use of, this overload protection operates without any destruction and above all, as will be detailed below in further embodiments, this circuit is self-starting. This means that, when the current consumer has been switched off and/or the current consumption has been brought to the normal range, the current consumer can resume its normal operation mode without any external influence being necessary.

According to an embodiment, the current-sensitive overload protection can be combined with the well-known technique of temperature-controlled overload protection, wherein both overload protection forms may be realized in a chip. The result, apart from higher sensitivity, can be cost advantageous when producing the respective overload circuit. By combining the temperature-sensitive and current-sensitive overload protections, a differentiation can be made as to whether the temperature increase is the consequence of an increased current through the current consumer or whether the temperature increase of the current consumer is the consequence of an increase in ambient temperature and/or a consequence of a neighboring device heating up.

Before embodiments will be detailed referring to the drawings, different measuring methods for detecting the current are explained.

On the one hand, the current may be detected via a so-called shunt resistor. Thus, the voltage drop across the shunt resistor which may be integrated in a separate chip or as a bondwire resistor on the transistor is compared to a voltage of a reference voltage source. This reference voltage, together with the shunt resistor, defines the threshold current:

$$I_S = \frac{U_0}{R_b}$$

$U_0$ being the reference voltage and $R_b$ being the shunt resistor value. An overcurrent comparator compares this threshold current to the current through the transistor and provides an output signal should the current through the transistor exceed the magnitude of the threshold current. This output signal of the comparator is used to close a switch between the gate terminal and the source terminal, the result being that both terminals are connected in a low-resistance fashion so that the enhancement MOSFET will be switched off.

In the other measuring method, it is not the current through the power transistor that is measured but a sense transistor is connected in parallel via which the current is detected. This sense transistor is exemplarily integrated on the same chip as the power transistor in order for its current to follow the power transistor current as far as possible. For gate-source voltages which are large compared to the voltage of the reference voltage source and thus the voltage drop across the shunt resistor, the current through the sense transistor is proportional to the current through the power transistor. The current ratio here is formed via the ratio of the channel widths of the load transistor and the sense transistor. It can be ensured by suitably selecting the channel widths of both transistors that the current through the sense transistor will be correspondingly smaller than the current through the power transistor.

The current through the sense transistor is measured as in the embodiment before, i.e. the current through the sense transistor is detected via a so-called shunt resistor. Thus, the voltage drop across the shunt resistor is compared to a voltage of a reference voltage source. A comparator compares the two values and, when exceeding the threshold value, provides an output signal which in turn is used to connect the gate terminal to the source terminal in a low-resistance fashion so that the enhancement MOSFET will be switched off.

The switch connecting the gate terminal and the source terminal in a low-resistance fashion may, for example, be realized by a thyristor, i.e. by a semiconductor layer assembly which will be blocking as long as there is no signal applied to the ignition input. This ignition input is connected to the output of the comparator, i.e. when the comparator provides an output signal, the thyristor will be ignited and will thus be conducting.

In a further embodiment, this thyristor may be replaced by a circuit including two transistors and two ignition inputs connected to the comparator.

FIG. 1 is a schematic illustration of an embodiment. Thus, the controllable current consumer 110 comprises a current path 120 and is connected to means 130 for detection the current. If the current detected is above a certain threshold value, a signal 140 will be transmitted to means 150 for altering the control signal. This in turn causes, by means of feedback, an alteration in the control signal 170 applied to the control input 180 and thus an alteration in the current through the controllable current consumer.

Figure 2:
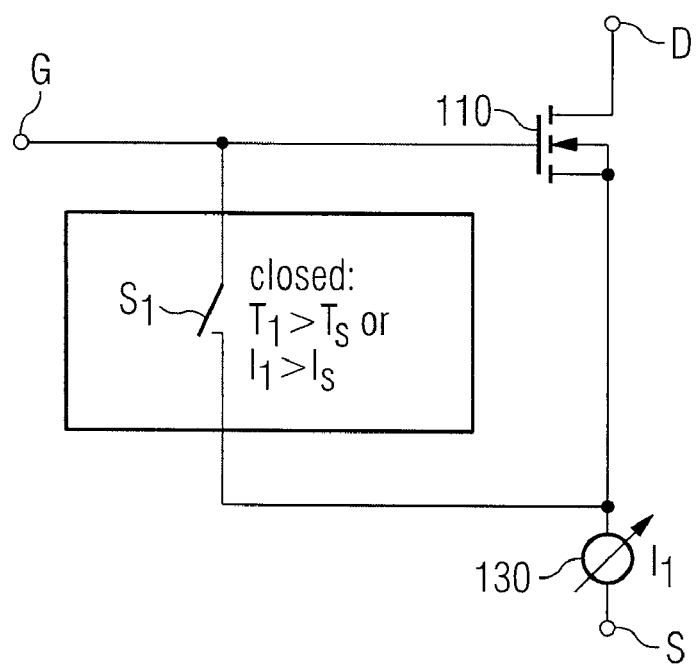
FIG. 2 shows a circuit in which the current consumer is an enhancement MOSFET, and represents a combination of the current-sensitive and temperature-sensitive overload protections.

FIG. 2 shows a first embodiment in which the controllable current consumer 110 can be an enhancement MOSFET and a current $I_1$ flows along the current path 120 between a drain terminal (D) and a source terminal (S). If the current $I_1$ measured by the means 130 for detecting the current is above a threshold current $I_s$ or if the temperature $T_1$ of the MOSFET 110 is greater than a threshold temperature $T_s$, a switch $S_1$ will be closed. Thus, the gate terminal (G) and the source terminal (S) are connected in a low-resistance fashion. Since the MOSFET in the embodiment is an enhancement MOSFET, the consequence is that the current between the drain terminal and the source terminal will be inhibited, which in turn protects the MOSFET from an overcurrent. This circuit may, for example according to an embodiment, be integrated in the chip 710.

Figure 3:
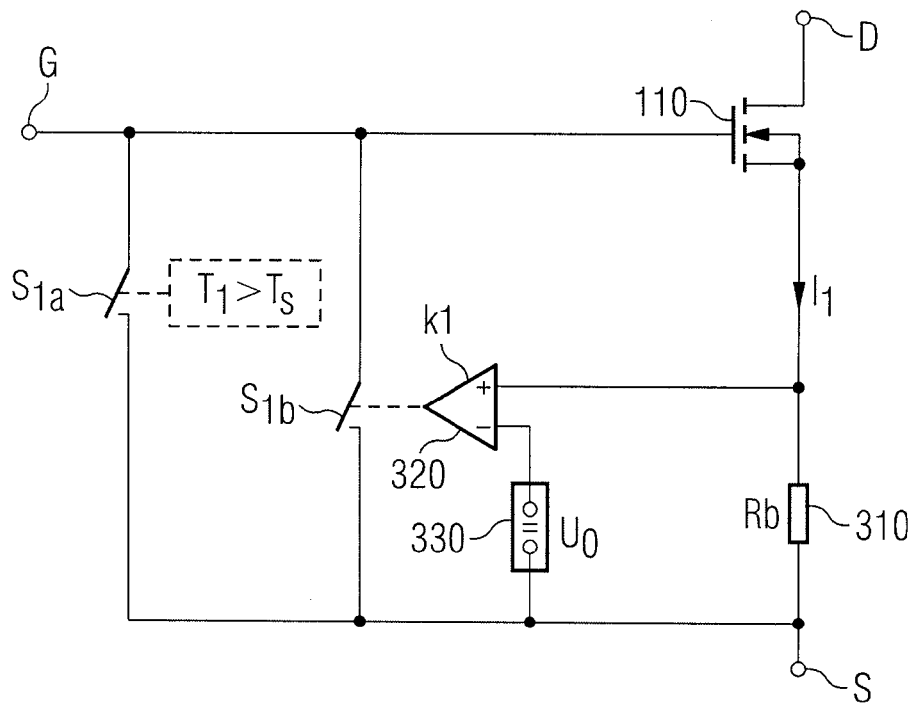
FIG. 3 shows a circuit in which the means for detecting the current measures the current of the current consumer directly.

FIG. 3 shows an embodiment of a circuit comparing the current $I_1$ to the threshold current $I_s$. The controllable current consumer again can be an enhancement MOSFET, including a source output, connected to the source terminal (S) via a resistor 310 on the one hand and to an input of a comparator 320 on the other hand. The other input of the comparator can be connected to a reference voltage source 330. The other pole of reference voltage source 330 to which the voltage $U_0$ is applied can be connected to the source terminal (S). In addition, according to an embodiment, a switch $S_{1a}$ and a switch $S_{1b}$ connected in parallel are located between the gate terminal (G) and the source terminal (S). The switch $S_{1a}$ is closed when the temperature $T_1$ of the enhancement MOSFET is greater than the threshold temperature $T_s$. The switch $S_{1b}$ is closed when the current $I_1$ exceeds the threshold value $I_s$. This will be the case when the voltage across the resistor 310 has a magnitude greater than the voltage $U_0$ of the reference voltage source 330 and, as a consequence, the comparator 320 provides an output signal. This output signal, according to an embodiment, has the effect that the switch $S_{1b}$ is closed.

This ensures that the current $I_1$ through the enhancement MOSFET is decreased or inhibited when either the temperature $T_1$ exceeds the threshold temperature $T_s$ or when the current $I_1$ becomes greater than a reference threshold current $I_s$ which can be calculated from the quotient of the voltage of the reference voltage source 330 and the resistor 310. The resistor 310 (shunt resistor) may, for example according to an embodiment, be integrated in the separate chip 710 or as a bondwire resistor in the controllable current consumer.

However, a disadvantage of this circuit is that the resistor 310 causes a voltage drop and thus power consumption even if the current intensity $I_1$ is smaller than the threshold current intensity $I_s$, i.e. when the transistor operates in the normal range. This can be avoided, according to an embodiment, if an additional sense transistor is connected in parallel and the current through the sense transistor is measured instead of $I_1$. This will be discussed in the following embodiment.

Figure 4:
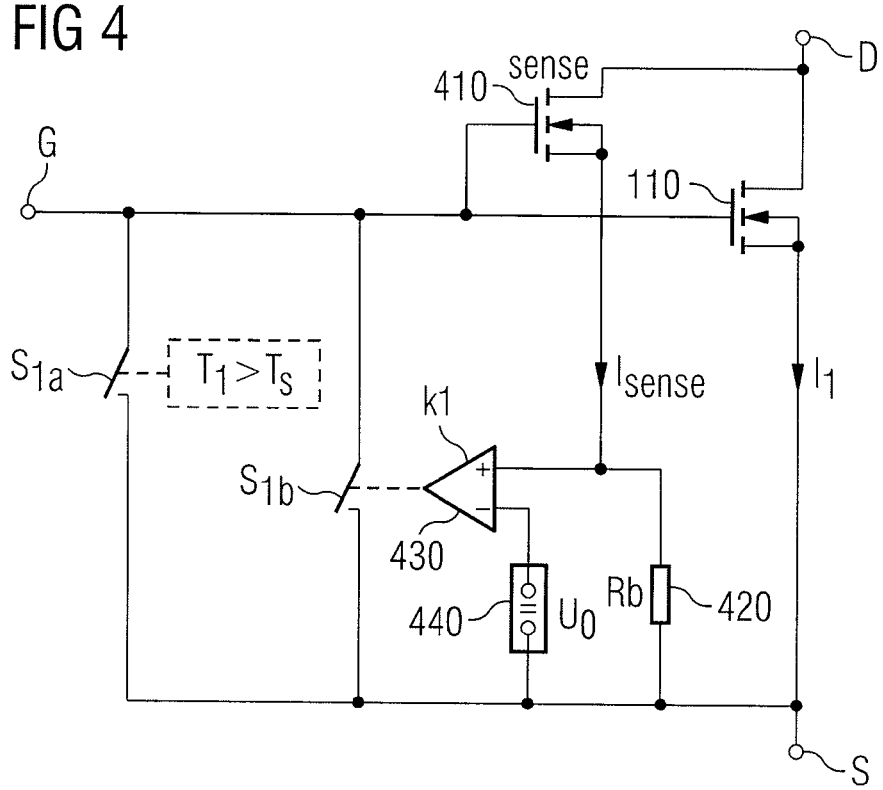
FIG. 4 shows a circuit in which the means for detecting the current measures the current of a sense transistor.

FIG. 4 illustrates the current detection via a sense transistor 410. It is integrated in the chip 720 in order for its current to follow the current $I_1$ as far as possible. The controllable current consumer exemplarily again can be an enhancement MOSFET, the drain terminal (D) being connected to the drain output of the sense transistor and to the drain output of the MOSFET. Additionally, the gate terminal (G) can be connected to the gate output of the MOSFET and to the gate output of the sense transistor. The switch $S_{1a}$ again can be located between the gate terminal (G) and the source terminal (S) and thus the switch $S_{1b}$ is in parallel thereto. According to an embodiment, the source output of the sense transistor is both connected to the source terminal (S) via the resistor 420 and to a first input of the comparator 430. A second input of the comparator 430 is connected to a reference voltage source 440 and the other pole of the reference voltage source 440 is connected to the source terminal (S), according to an embodiment.

The switch $S_{1a}$ in turn is closed when the temperature $T_1$ is greater than a threshold temperature $T_s$. The switch $S_{1b}$ is closed when the comparator 430 provides an output signal. This is the case when the voltage across the resistor 420 is greater than the voltage of the reference voltage source 440. Thus, the enhancement FET is switched off when the temperature exceeds the threshold temperature $T_s$ and when the current through the sense transistor ($I_{sense}$) becomes greater than the reference current $I_s$ which may be calculated from the quotient of the voltage of the reference voltage source 440 and the resistor 420. For gate-source voltages which are great compared to the voltage of the reference voltage source and thus the voltage drop across the resistor 420, the current $I_{sense}$ is proportional to the current $I_1$. According to an embodiment, the current ratio is calculated from the ratio of the channel widths of the MOSFET and the sense transistor.

An advantage of this embodiment compared to the embodiment shown in FIG. 3 is that, with a smaller channel width of the sense transistor 410 compared to the channel width of the power transistor 110, the current through the sense transistor 410 will become correspondingly small with an equal control voltage and thus the power dissipation in the current measurement will be smaller than the power dissipation in the current measurement in the embodiment shown in FIG. 3.

Both in the embodiment of FIG. 3 and in the embodiment of FIG. 4, both switches $S_{1a}$ and $S_{1b}$ have been connected in parallel. Thus, the result is an OR linking of the two conditions: $T_1$ greater than $T_s$; $I_1$ and/or $I_{sense}$ greater than $I_s$. In another embodiment, the two switches may be connected in series so that the current between the drain terminal (D) and the source terminal (S) is only interrupted when both conditions are satisfied at the same time, i.e. when both the temperature and the current intensities are greater than the threshold values.

Figure 5:
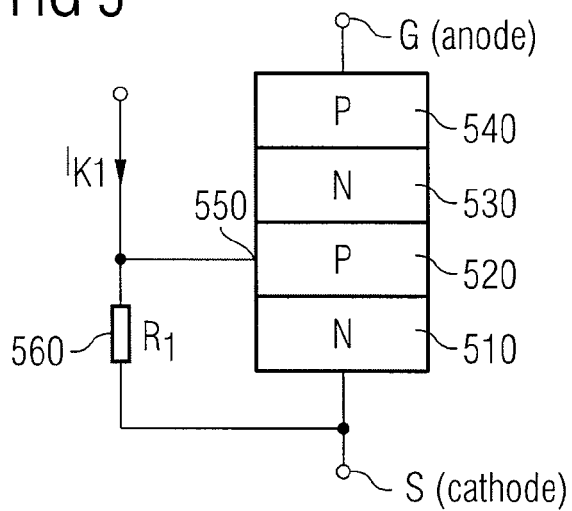
FIG. 5 shows a thyristor circuit as means for altering the control signal.

FIG. 5 shows an embodiment of the switch $S_{1b}$. This is a thyristor connected with its anode to the gate terminal (G) and with its cathode to the source terminal (S). The thyristor consists of four semiconductor layers 510, 520, 530 and 540 which are alternatingly n-doped and p-doped, the bottom-most layer 510 being an n-doped semiconductor layer. At the first p-doped semiconductor layer 520 the thyristor has a signal input 550 connected to the output of the comparator 320 and/or 430. In addition, a resistor 560 is arranged between the signal input 550 and the cathode of the thyristor.

In an unignited state, no current flows between the anode and the cathode. However, when a signal current is applied to the signal input, the thyristor is ignited and represents a low-resistance resistor between the cathode and the anode. This is the case when the current $I_1$ has exceeded the threshold current $I_s$ and, as a consequence, the comparator 320 and/or 430 has provided a corresponding output signal. In addition, this thyristor ignites when it has heated up to a certain temperature threshold $T_s$ tuned to a critical power consumption and resulting by a corresponding doping and selection of the resistor 560. Thus, the thyristor realizes both switches, $S_{1a}$ and $S_{1b}$, in an OR linking. It is also to be mentioned that the design of the switch using a thyristor is latching, i.e. the switch will remain closed until the voltage between the anode and the cathode has decreased, ensuring that the MOSFET is really blocked. Subsequently, the controllable current consumer can be operated again normally without any external influence being necessary. Thus, this thyristor realization of the switches is a robust, low-maintenance and efficient one.

Figure 6:
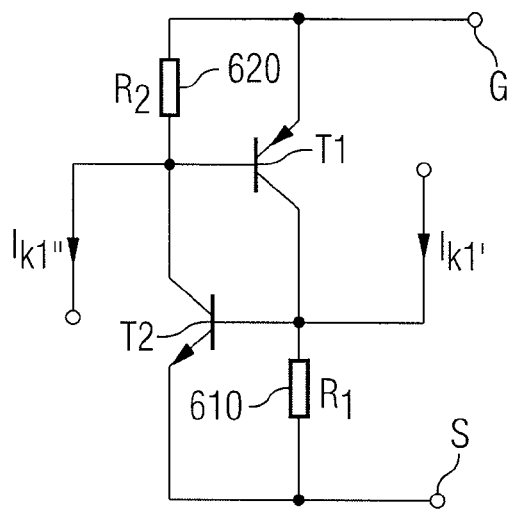
FIG. 6 shows a circuit consisting of two transistors and two resistors as means for altering the control signal.
Figure 7:
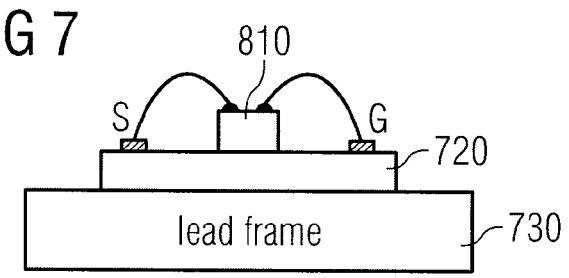
FIG. 7 is a cross-section of a device for a temperature-controlled overload protection of an MOSFET.

FIG. 6 shows a realization of the switch having the same characteristics as the switch described in FIG. 5, wherein, according to an embodiment, the thyristor has been replaced by a circuit consisting of a first transistor T1 and a second transistor T2 and two resistors 610 and 620. Thus, the emitter of the first transistor T1 is connected to the gate terminal (G) and the base of the first transistor T1 is connected to the collector of the second transistor T2. In addition, the collector of the first transistor T1 is connected to the base of the second transistor T2 and the emitter of the second transistor T2 is connected to the source terminal (S). The resistor 610 is arranged between the emitter and the base of the second transistor T2 and the resistor 620 is arranged between the emitter of the first transistor T1 and the base of the first transistor T1. Furthermore, the output of the comparator is coupled both to the base of the first transistor T1 and to the base of the second transistor T2.

The mode of functioning of this circuit corresponds to that of the thyristor described in FIG. 5. Consequently, the gate terminal (G) and the source terminal (S) are connected in a low-resistance fashion when either the comparator provides a signal or when a certain temperature threshold is exceeded, which in turn can be influenced by the selection of the resistors 610 and 620 and the dopings of the transistors and results from a critical power consumption. Like before, there is an OR linking between the two conditions: exceeding a temperature threshold and exceeding a current threshold.

It is also to be mentioned that the dopings of semiconductor devices may be exchanged, according to an embodiment, i.e. a p-channel power transistor may be used for the controllable current consumer 110. Additionally, according to another embodiment, the controllable current consumer may also be a bipolar transistor or any other electrical device the current of which is controllable via a control input.

The embodiments explained in greater detail above are based on an enhancement MOSFET which becomes blocking of its own accord when falling below a gate-source voltage. When using other transistor types, such as, for example, a barrier layer FET or a normally-on MOSFET, according to other embodiments, however, it may be necessary for the magnitude of the gate-source voltage to exceed a certain threshold to become blocking and/or to reduce the current so that the transistor is not overloaded and thus there is no more destruction danger. In addition to the embodiments mentioned above, other embodiments can be noted, in which, for example, the gate-source voltage is increased in an overload case, exemplarily by applying an external voltage source.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for protecting a current consumer, the current consumer comprising a current path between two current path terminals and a control terminal to which a control signal may be applied by means of which a current through the current path is controllable, comprising:
   a detector for detecting the current in the current path; and
   an alterer for altering the control signal,
   wherein the alterer for altering the control signal is implemented to alter the control signal such that when a current value above a threshold value is detected the control signal causes a current reduction,
   wherein the control signal is a control voltage, wherein the alterer for altering the control signal is implemented as a thyristor which is connected between the control input and a reference terminal such that the control voltage is applied to the thyristor, wherein the thyristor additionally comprises an ignition input to which the control signal of the detector for detecting the current may be applied, and
   wherein the thyristor comprises semiconductor layers which are such that the thyristor becomes conducting without an ignition signal when exceeding a temperature threshold, wherein the semiconductor layers are implemented such that the temperature threshold corresponds to a maximum temperature allowed for the current consumer.

2. The device according to claim 1, wherein the current consumer is an FET or a bipolar transistor, wherein the detector for detecting the current is implemented to measure the current between a drain terminal and a source terminal of the FET or between a collector and an emitter of the bipolar transistor, and wherein the alterer for altering the control signal is implemented to alter a voltage applied to a gate terminal of the FET or to a base of the bipolar transistor.

3. The device according to claim 1, wherein the alterer for altering the control signal is also implemented to alter the control signal starting from a temperature threshold to cause a current reduction.

4. The device according to claim 1, wherein the alterer for altering the control signal is implemented to alter the control signal starting from a temperature threshold and only if the current is above the current threshold to cause a current reduction.

5. The device according to claim 1, wherein the detector for detecting the current additionally comprises:
   a resistor connected in series to the current path;
   a detector for detecting a voltage across the resistor; and
   a comparator for comparing the voltage detected to a reference voltage, wherein the comparator for comparing is implemented to provide a comparator signal when the voltage detected exceeds the reference voltage,
   the alterer for altering is implemented to alter the control signal when reaching the comparator signal to cause a current reduction.

6. The device according to claim 1, wherein the detector for detecting the current comprises:
   a current divider implemented to divide an input current into the current and a measuring current, wherein the measuring current is in a defined relation to the current through the current path and smaller than the current through the current path;
   a resistor through which the measuring current flows;
   a detector for detecting a voltage across the resistor when the measuring current flows through the resistor; and
   a comparator for comparing the voltage detected to a reference voltage,
   wherein the comparator for comparing is implemented to provide a comparator signal when the voltage detected exceeds the reference voltage; and
   wherein the alterer for altering the control signal is implemented to alter the control signal when reaching the comparator signal to cause a current reduction.

7. The device according to claim 6, wherein the current consumer is a current consumer transistor, and wherein the current divider comprises a sense transistor comprising a control terminal comprising smaller a channel width than the current consumer transistor, and wherein the control terminal of the sense transistor is coupled to the control terminal of the current consumer transistor.

8. The device according to claim 7, wherein the sense transistor is integrated with the current consumer transistor on the same substrate.

9. The device according to claim 1, wherein the current consumer is a normally-off transistor comprising a blocked current path at a voltage between gate and source smaller than a threshold voltage, wherein the alterer for altering the control signal is implemented to bring the magnitude of the control signal below the threshold voltage when a current above the threshold is detected.

10. The device according to claim 1, wherein a resistor is connected between the ignition input and a cathode of the thyristor.

11. The device according to claim 1, wherein the control signal is a control voltage, and wherein the alterer for altering the control signal comprises:
   a resistor connected between a first current path input and a first input for an ignition signal;
   a resistor connected between a second current path input and a second input for an ignition signal;
   a first bipolar transistor or FET; and
   a second bipolar transistor or FET,
   wherein an emitter or source terminal of the first transistor is connected to the second current path input and a base or gate terminal of the first transistor is connected to the second input for the ignition signal, and the collector or drain terminal of the first transistor is connected to a base or gate terminal of the second transistor and is additionally connected to the first input for the ignition signal, and an emitter or source terminal of the second transistor is connected to the first current path input and a collector or drain terminal of the second transistor is connected to the base or gate terminal of the first transistor.

12. A device for protecting a current consumer, the current consumer comprising a current path between two current path terminals and a control terminal to which a control signal may be applied by means of which a current through the current path is controllable, comprising:
   a current detector coupled with the current path; and
   means for altering the control signal such that when a current value above a threshold value is detected the control signal causes a current reduction,
   wherein the control signal is a control voltage, wherein the means for altering the control signal is implemented as a thyristor which is connected between the control input and a reference terminal such that the control voltage is applied to the thyristor, wherein the thyristor additionally comprises an ignition input to which the control signal of the detector for detecting the current may be applied, and wherein the thyristor comprises semiconductor layers which are such that the thyristor becomes conducting without an ignition signal when exceeding a temperature threshold, wherein the semiconductor layers are implemented such that the temperature threshold corresponds to a maximum temperature allowed for the current consumer.

13. The device according to claim 12, wherein the current consumer is an FET or a bipolar transistor, wherein the current detector is implemented to measure the current between a drain terminal and a source terminal of the FET or between a collector and an emitter of the bipolar transistor, and wherein the means for altering the control signal is implemented to alter a voltage applied to a gate terminal of the FET or to a base of the bipolar transistor.

14. The device according to claim 12, wherein the current detector additionally comprises:
    a resistor connected in series to the current path;
    a detector for detecting a voltage across the resistor; and
    a comparator for comparing the voltage detected to a reference voltage, wherein the comparator for comparing is implemented to provide a comparator signal when the voltage detected exceeds the reference voltage,
    wherein the means for altering is implemented to alter the control signal when reaching the comparator signal to cause a current reduction.

15. The device according to claim 12, wherein the current detector comprises:
    a current divider implemented to divide an input current into the current and a measuring current, wherein the measuring current is in a defined relation to the current through the current path and smaller than the current through the current path;
    a resistor through which the measuring current flows;
    a detector for detecting a voltage across the resistor when the measuring current flows through the resistor; and
    a comparator for comparing the voltage detected to a reference voltage,
    wherein the comparator for comparing is implemented to provide a comparator signal when the voltage detected exceeds the reference voltage; and
    wherein the means for altering the control signal is implemented to alter the control signal when reaching the comparator signal to cause a current reduction.

16. The device according to claim 12, wherein the current consumer is a current consumer transistor, and wherein the current divider comprises a sense transistor comprising a control terminal comprising a smaller channel width than the current consumer transistor, and wherein the control terminal of the sense transistor is coupled to the control terminal of the current consumer transistor.

17. The device according to claim 16, wherein the sense transistor is integrated with the current consumer transistor on the same substrate.

18. The device according to claim 12, wherein the current consumer is a normally-off transistor comprising a blocked current path at a voltage between gate and source smaller than a threshold voltage, wherein the means for altering the control signal is implemented to bring the magnitude of the control signal below the threshold voltage when a current above the threshold is detected.

19. The device according to claim 12, wherein a resistor is connected between the ignition input and a cathode of the thyristor.

20. The device according to claim 12, wherein the control signal is a control voltage, and wherein the means for altering the control signal comprises:
    a resistor connected between a first current path input and a first input for an ignition signal;
    a resistor connected between a second current path input and a second input for an ignition signal;
    a first bipolar transistor or FET; and
    a second bipolar transistor or FET,
    wherein an emitter or source terminal of the first transistor is connected to the second current path input and a base or gate terminal of the first transistor is connected to the second input for the ignition signal, and the collector or drain terminal of the first transistor is connected to a base or gate terminal of the second transistor and is additionally connected to the first input for the ignition signal, and an emitter or source terminal of the second transistor is connected to the first current path input and a collector or drain terminal of the second transistor is connected to the base or gate terminal of the first transistor.

* * * * *